United States Patent [19]

Yoshioka et al.

[11] Patent Number: 5,160,781
[45] Date of Patent: Nov. 3, 1992

[54] POLYIMIDE COMPOSITION AND PREPREG AND LAMINATE THEREOF

[75] Inventors: Shingo Yoshioka; Kenzi Ogasawara; Yoshihide Sawa; Tokio Yoshimitsu, all of Kadoma, Japan

[73] Assignee: Matsushita Electric Works, Ltd., Osaka, Japan

[21] Appl. No.: 496,634

[22] Filed: Mar. 21, 1990

[30] Foreign Application Priority Data

Apr. 25, 1989 [JP] Japan .................................. 1-105268
May 12, 1989 [JP] Japan .................................. 1-119153
Dec. 22, 1989 [JP] Japan .................................. 1-333456

[51] Int. Cl.$^5$ .............................................. B32B 15/08
[52] U.S. Cl. ........................................ 428/224; 428/244; 428/288; 428/901
[58] Field of Search ............... 428/224, 288, 244, 901; 526/261

[56] References Cited

U.S. PATENT DOCUMENTS 4,752,641  6/1988  Koyama et al. .................... 526/261

FOREIGN PATENT DOCUMENTS 20659    2/1984   Japan .
40322    2/1986   Japan .
1505596  3/0000   United Kingdom .

OTHER PUBLICATIONS

Ullmann's Encyclopedia of Industrial Chemistry, Fifth, Completely Revised Edition, vol. A 9.
JP56-127612 (Abs.), Oct. 6, 1981.
JP 53-133427 (Abs.), Nov. 21, 1978, Adhesive Varnish for Voice Coils.
JP 60-260625 (Abs.), Dec. 23, 1985, Polyamide Resin Production.

*Primary Examiner*—Patrick J. Ryan
*Assistant Examiner*—Richard C. Weisberger
*Attorney, Agent, or Firm*—Burns, Doane, Swecker & Mathis

[57] ABSTRACT

A polyimide composition is obtained by adding triallyl isocyanurates to polyimide, preferably with further addition of an accelerator and diluting solvent. The composition is made to show effective reduction in dielectric constant as well as in the inherent viscosity and surface tension so that, when employed in manufacturing laminates, the degree of impregnation into base material can be elevated to remarkably improve resin filling.

8 Claims, No Drawings

POLYIMIDE COMPOSITION AND PREPREG AND LAMINATE THEREOF

BACKGROUND OF THE INVENTION

1. Field of the Invention

This invention relates to a polyimide composition, a prepreg formed with the polyimide composition and a polyimide laminate formed with the prepregs laminated and set.

The polyimide laminate of the kind referred to is effectively utilizable in manufacturing printed-wiring boards, in particular, highly multilayered wiring substrate and so on for high-density mounting use.

2. Description of the Related Art

The polyimide laminate has been increasingly utilized in recent years in manufacturing the multilayered wiring substrate, because of such characteristics that polyimide allows wiring conductor to be finely dimensioned and such high precision work as fine perforation and the like made possible for adaption of the wiring substrate to the high-density mounting, that the polyimide laminate shows only a small thermal expansion coefficient in the direction of thickness in laminated state of the prepregs and is thus high in the reliability of electric conduction attainable by means of through-hole metal plating, that polyimide involves no smear generation during drilling step, that high hardness and adhesion with respect to conducting member at higher temperatures render the mountability excellent, that the laminate is durable in consecutive use under such high temperatures as around 200° C., and so on. The multilayered wiring substrate employing polyimide has been disclosed in, for example, Japanese Patent Application Laid-Open Publication No. 59-20659 or 61-40322.

It has been generally demanded, on the other hand, that the multilayered wiring substrate is effectively lowered in the dielectric constant to allow a high speed signal propogation to be enabled, and a measure for providing a substrate of the kind referred to which is higher reliable in the through-hole conduction and low in dielectric constant has been disclosed in, for example, U.S. Pat. application Ser. No. 165,011.

Such known composition as well as the multilayered wiring substrate formed by the composition as has been referred to are, however, still defective in attaining sufficiently highly reliable conduction for being fully satisfactory particularly in respect of the through-hole plating made in the substrate, and this deficiency is required to be removed for realizing the wiring substrate adapted to the high-density mounting.

SUMMARY OF THE INVENTION

A primary object of the present invention is, therefore, to provide a polyimide composition capable of improving the filling ability of polyimide with respect to the base material, realizing the high-density mounting with a highly reliable conduction assured in preparing the polyimide laminate and forming the through-holes in the laminate, and elevating the safety of electronic devices and equipments including the polyimide laminate provided with a sufficient nonflammability.

According to the present invention, this object is attained by means of a polyimide composition comprising triallyl isocyanurates added in a range of 10 to 200 parts by weight to 100 parts by weight of polyimide.

Other objects and advantages of the present invention shall be made clear in following description of the invention detailed with reference to preferred embodiments.

While the present invention shall be described with reference to the preferred embodiments, it should be appreciated that the intention is not to limit the invention only to the embodiments described but rather to include all alterations, modifications and equivalent arrangements possible within the scope of appended claims.

DETAILED DESCRIPTION OF THE PREFERRED EMBODIMENTS

Polyimide employed in the present invention can be obtained by bringing unsaturated bis-imides into reaction with diamines, in which case it is preferable to have at least one of alkyl group and alkylene group except methylene group contained more that 11 wt.% in polyimide. This is for the reason that, when alkyl group or alkylene group except methylene group has a chemical structure of less than 11 wt.% within resin molecules, the dielectric constant of polyimide cannot be lowered by such group sufficiently as a material for the multilayered wiring substrate.

For unsaturated bis-imide, such ones as represented by following formula (I) may be employed and, for diamine, such ones as represented by following formula (II) may be employed:

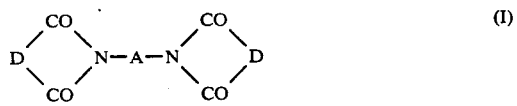

in which formula (I) "D" denotes bivalent group including double binding between carbon-carbon, and "A" denotes bivalent group containing at least two carbon atoms;

in which formula (II) "B" denotes bivalent group having less than 30 carbon atoms.

"A" in the formula (I) and "B" in the formula (II) may either be identical to or different from each other, and may be either one of linear chain or branched alkylene group having less than 13 carbon atoms, cyclic alkylene group having in the ring 5 or 6 carbon atoms, heterogeneous cyclic group including at least one of O, N and S atoms, or phenylene or polycyclic aromatic group. These groups should preferably be the ones having a substituent group which causes no unnecessary secondary reaction under such reaction conditions as a reaction temperature in a range of 70 to 170° C. and a reaction time in a range of 30 to 350 minutes.

Further, "A" and "B" in the formulas (I) and (II) may be any of various phenylene groups or such alicyclic groups as the ones bound directly or by bivalent atoms or by following molecules, for which groups there may be employed oxygen or sulfur, alkylenes of one or three of alkylenes, or one selected from the followings: —NK$_4$—; —P(O)R$_3$13 ; —N=N—; —O=N—; —CO—O—; —SO$_2$13 ; —SiR$_3$R$_4$—; —CONH—: —NY—CO—X—CO—NY—; —O—CO—X—CO—O—;

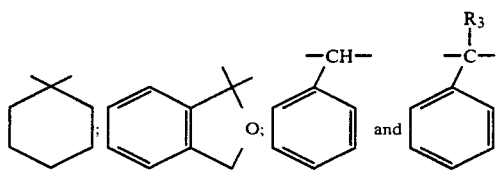

in which $R_3$, $R_4$ and $Y_1$ represent respectively alkyl group of 1 to 4 carbon atoms, cyclic alkyl group having in the ring 5 or 6 carbon atoms, or phenyl or polycyclic aromatic group, and "X" denotes linear-chain or branched alkylene group having less than 13 carbon atoms, cyclic alkylene group having in the ring 5 or 6 carbon atoms, or monocyclic or polycyclic allylene group.

For preferable unsaturated bis-imide to be employed in the above formula (I), there may be listed such ones as follows:
N,N'-ethylene-bis-imide maleate,
N,N'-hexamethylene-bis-imide maleate,
N,N'-methaphenylene-bis-imide maleate,
N,N'-para-phenylene-bis-imide maleate,
N,N'-4,4'-diphenylmethane-bis-imide maleate [also called generally N,N'-methylene-bis(N-phenylmaleimide)],
N,N'-4,4'-diphenylether-bis-imide maleate,
N,N'-4,4'-diphenylsulfone-bis-imide maleate,
N,N'-4,4'-dicyclohexylmethane-bis-imide maleate,
N,N'-α,α'-4,4'-dimethylenecyclohexane-bis-imide maleate,
N,N'-metaxylene-bis-imide maleate,
N,N'-diphenylcyclohexane-bis-imide maleate,
1,3-bis(2-p-anilinopropylidene)benzene-bis-imide,
1,4-bis(2-p-anilinopropylidene)benzene-bis-imide,
1,4-bis(2-m-anilinopropylidene)benzene-bis-imide,
4,4'-methylene-di-2,6-xylidine-bis-imide,
4,4'-methylene-di-2,6-diethylaniline-bis-imide,
4,4'-diamino-3,3'diethyl-5,5'-dimethyldiphenylmethane-bis-imide,
4,4'-methylene-di-2,6-diisopropylaniline-bis-imide,
2,5-dimethyl-p-phenylenediamine-bis-imide,
2,2-bis(4-aminophenyl)propane-bis-imide,
2,4-diaminomesitylene-bis-imide,
3,5-diethyl-2,4-tolylenediamine-bis-imide and the like.

For preferable diamine to be employed in the foregoing formula (II), such ones as follows are enumerated:
4,4'-diaminodicyclohexylmethane,
1,4-diaminocyclohexane,
2,6-diaminopyridine,
m-phenylenediamine,
p-phenylenediamine,
4,4'-diaminodiphenylmethane,
2,2-bis(4-aminophenyl)propane,
benzidine,
4,4'-diaminophenyl oxide,
4,4'-diaminodiphenyl sulfide,
4,4'-diaminodiphenyl sulfone,
bis-(4-aminophenyl)diphenylsilane,
bis-(4-aminophenyl)methylphosphine oxide,
bis-(3-aminophenyl)methylphosphine oxide,
bis-(4-aminophenyl)phenylphosphine oxide,
bis-(4-aminophenyl)phenylamine,
1,5-diaminonaphthalene,
m-xylylenediamine,
p-xylylenediamine,
1,1-bis(p-aminophenyl)phthalane,
hexamethylenediamine,
1,3-bis(2-p-anilinopropylidene)benzene,
1,4-bis(2-m-anilinopropylidene)benzene,
4,4'-methylene-di-2,6-diethylaniline,
4,4'-diamino-3,3'-diethyl-5,5'-diphenylmethane,
4,4'-methylene-di-2,6-diisopropylaniline,
2,5-dimethyl-p-phenylenediamine,
2,2-bis(4-aminophenyl)propane,
2,4-diaminomesitylene,
3,5-diethyl-2,4-tolylenediamine, and the like.

Further, by bringing bis-imide and diamine into reaction with each other, it is possible to prepare an addition type polyimide. Composition ratio of bis-imide and diamine should preferably be in a range, in mol ratio, of 1.7 to 2.5 of bis-imide with respect to 1 of diamine. When bis-imide is less than 1.7, there arises a tendency that the production of polymeric mass is increased to shorten required setting time so as to render the composition poor in the handleability, while bis-imide made above 2.5 causes non-reacted raw material likely to be remained much. The reaction may be carried out in a state in which bis-imide and diamine are solved by such solvent as N-methyl-2-pyrrolidone (NMP), N-N'-dimethylacetamide (DMAC) or the like, under such reaction conditions that the heating temperature is in a range of 70 to 170° C. and the reaction time is in a range of about 30 to 350 minutes.

According to a remarkable feature of the present invention, the polyimide composition is prepared by blending, with respect to 100 parts by weight (which shall be hereinafter referred to simply as "part" or "parts") of polyimide, 10 to 200 parts of triallyl isocyanurates (hereinafter "TAIC"), and adding thereto imidazoles, organic peroxides or the like as an accelerator and one or a mixture of two or more selected from a group consisting of dimethylformamide (DMF), DMAC, dioxane, NMP, methyl ethyl ketone, methyl cellulose and the like as a diluting solvent.

By increasing the added amount of TAIC in the above, an action of lowering the dielectric constant of the laminate eventually obtained with the foregoing composition can be attained, while the addition less than 10 parts does not allow the dielectric constant to be lowered to any satisfactory level and the addition exceeding 200 parts allows the dielectric constant to be lowered but causes the eventual laminate to be too high in the hardness so as to become brittle undesirably, rendering the product less reliable in the strength. The addition of TAIC is effective to lower the inherent viscosity and hence the surface tension of the composition obtained, so as to render the infiltration of the composition into spaces between fibers forming base material to be excellent, and a prepreg remarkably improved in the resin filling into the base material can be obtained.

In the laminate formed by laminating and setting a plurality of such prepregs of the polyimide composition, therefore, it is made possible to minimize any undersirable infiltration of through-hole plating solution into the structure of the laminate upon formation of through holes for adapting the laminate to the multilayered wiring substrate, that is, the depth or extent of such infiltration of the plating solution on peripheral surface of the through holes made in the laminate can be remarkably shortened. At the same time, the peripheral surface of the through holes can be covered by the plated metal which shows a remarkably smooth finishing. Consequently, a desired electric insulation of printed circuits incorporated in the laminate from the through holes can be well maintained while required conduction between required ones of the circuits or the like through the through holes can be attained at a high stability.

When TAIC is added along with, for example, a TAIC polymer, it is preferable to add them in a range of 0 to 100 parts of TAIC with respect to 1 part of the TAIC polymer. Their addition in this range of TAIC and its polymer renders TAIC prepolymer to be contained in the TAIC polymer, so that any abrupt volatilization of TAIC during required drying in the prepreg manufacturing steps to be effectively restrained, whereby the polyimide composition with which the base material of the prepreg is impregnated can be half-set in a sufficiently stabilized state to obtain excellent prepregs, so that the prepregs remarkably improved in the resin filling into the base material can be eventually prepared.

When TAIC polymer is added concurrently with TAIC, the addition of TAIC polymer by about 1 part with respect to 100 parts of polyimide will be effective to have the foregoing effect shown, and even the addition of TAIC polymer only may suffice the purpose. Further, it is preferable to use TAIC polymer of a weight-average molecular weight in a range of 500 to 10,000 and, more particularly, 500 to 3,000. In the case of TAIC polymer less than 500 weight-average molecular weight, TAIC polymer does not cause the desired action to take place while TAIC polymer exceeding 10,000 weight-average molecular weight renders the eventual composition to be lowered in the plasticity, so that the obtained prepreg will be deteriorated in the interlaminar bonding and resultant laminate becomes too hard and brittle. When the laminate formed with such brittle polyimide composition is subjected to the work of making the through holes for utilizing the laminate as the wiring substrate, the laminate shows a tendency of easily forming cracks in the peripheral surface of the through holes made, and this tendency becomes more remarkable when the through holes are provided at a higher density in order to adapt the substrate to the high density mounting. When the through holes involves the cracks, the conductor metal of the through-hole plating is caused to enter into such cracks, so as not to allow the required insulation to be kept between the through holes and the incorporated circuits in the substrate, and the highly reliable conduction cannot be assured any more. The weight-average molecular weight of TAIC polymer is to be obtained by means of the THF-GPC measurement, on the basis of monomer calibration curve.

In securing the nonflammability required for the safety of the electronic devices and equipments employing the multilayered wiring substrate made of the synthetic resin composition, it is required to mix the polyimide composition with bromic resin having a reactive group as a flame retardant, and it is particularly preferable to employ the bromic resin having the reactive group in a range of 1 to 50 parts in bromine content weight with respect to 100 parts of the polyimide resin. In this case, the bromine content of less than 1 part does not allow the nonflammability to be attained while the content exceeding 50 parts render the eventual laminate to be deteriorated in its function with the thermal resistance lowered and the dielectric constant raised. When the bromic resin having the reaction group is used as the flame retardant, the bromic resin reacts to side chain and end group of the polyimide resin to be taken into structural frame of the polyimide resin, so as to provide to the polyimide resin concurrently such functions as the interlaminar bonding, reliability of the through-holes, thermal resistance and nonflammability.

Therefore, the bromic resin can be properly employed as selected from such ones having epoxy group, allyl group, vinyl group and so on as the reactive group as alkyl, phenyl or polycyclic aromatic series having 1 to 4 carbon atoms, linear-chain or branched alkylene having less than 13 carbon atoms, cyclic alkylene having 5 to 6 carbon atoms in the ring, monochain or polycyclic allylene and the like. As the most preferable reactive group, in particular, the epoxy group may be enumerated in respect of its capability of maintaining or improving the thermal resistance and interlaminar bonding.

In obtaining the prepreg from the polyimide composition referred to in the above, the base material is impregnated with the polyimide composition, thereafter the reaction of polyimide to TAIC polymer or TAIC is made to advance while drying and evaporating the diluting solvent, and the composition filling the base material can be half-set. While thus obtaining the prepreg, the bromic resin having the reactive group and mixed in the composition for providing thereto the nonflammability is also made to react at the reactive group to the side chain and end group of polyimide and to be taken into the structural frame of polyimide.

The base material to be impregnated with the polyimide composition may not be particularly limited in the type, but it is general that glass cloth is employed therefor. Further, any one of such inorganic fiber cloth as quartz fiber cloth and the like and such highly thermally resisting organic fiber cloth as polyimide fiber cloth and the like may be used.

The half-setting for forming the prepreg should preferably be carried out at a temperature of 110 to 155° C., since the temperature exceeding 155° C. causes in particular TAIC to become likely to volatile much and the reaction to be too accelerated so that the interlaminar bonding of the resultant prepreg will be lowered and the effect of lowering the dielectric constant will be less while the temperature below 110° C. renders required processing time to be prolonged to impair the productivity. Here, the half-set state of the resin composition forming the prepreg is to represent so-called B-stage between A-stage and C-stage in the setting process of thermosetting resin, in which state the resin can be fluidized when heated to advance further the setting reaction.

From the foregoing prepreg of the polyimide composition, next, it is possible to prepare the laminate. As occasion demands, a plurality of the prepregs may be laminated with circuit patterns of foils or layers of such a metal as copper, nickel, aluminum or the like. In this case, laminating and molding themselves of the prepregs may be carried out in any manner well known to ones skilled in the art. In forming the laminate, the polyimide composition comprising polyimide of the foregoing chemical structure and combined with TAIC's is employed, and the impregnation of the base material with the composition can be sufficiently realized. With this laminate employed, the dielectric constant of the laminate can be lowered, and the filling ability made high of the polyimide composition with respect to the base material allows to realize such effects that the smear is less generated upon the drilling work for the through holes, and that the infiltrating depth of the through-hole plating solution into the laminate at the peripheral surface of the through holes is practically minimized so that the through-hole plating can be smoothly formed, the insulating ability of the through holes with respect to the circuit patterns incorporated can be well improved and, as a whole, the highly reliable conduction can be ensured. In the case of the laminate formed with the polyimide composition containing TAIC and combined with the bromic resin having the reactive group, further, the laminated is concurrently provided with such functions as the interlaminar bonding, through-hole reliability, thermal resistance and nonflammability, which functions will be extremely useful characteristics of the laminate when the same is made multilayered particularly to be more than eight layers.

EXAMPLES 1-25

The polyimide composition was obtained in many ways with such varying composition ratio as shown in Tables 1 and 2 attached herewith. Except for the one of Example 7, the thus obtained composition was used for the impregnation of E-glass cloth 0.1 mm thick and 95g/m$^2$, and their prepregs were obtained through a drying carrying out in a dryer at 140° C. for 40 minutes. In the case of Example 7, D-glass cloth 0.1 mm thick and 105g/m2 was used instead of the E-glass cloth and the prepreg was obtained through the same drying step as above. Both-surface-roughened copper foils 18μm thick were placed on both surfaces of each of the prepregs, the lamination molding was carried out with a steam press under molding conditions of a temperature of 130° C., molding pressure of 30kg/cm$^2$ and for 90 minutes, and both-surface copper-clad laminates for use in making internally printed wiring board were obtained. The copper foils on the thus obtained both-surface copper-clad laminates were subjected to an etching process for forming the circuit pattern to prepare the internally printed wiring boards, 35 sheets of such wiring boards were stacked with 4 sheets of the same prepregs as in the above interposed between the respective wiring boards, a copper foil 35μm thick was further stacked on each of top and bottom surfaces of the thus stacked boards, with 4 sheets of the prepregs interposed, the entire stack was then accommodated in a mold of 6mm, and the stack was subjected to the steam press under the conditions of 5kg/m$^2$ and 130° C. for 20 minutes. Thereafter, the stack was heated at 200° C. under a pressure of 30kg/m$^2$ for 120 minutes, then the stack was cooled down to the room temperatures with the pressure kept applied, and a multilayered both-surface copper-clad laminate was eventually obtained. Examples 5 and 13 are comparative examples, the TAIC polymer having a molecular weight 20,000.

In Tables 1 and 2, #1 denotes a synthetic of N,N'-4,4'-diphenylmethane-bis-imide maleate and 4,4'-diaminodiphenylmethane, which does not have any alkyl group or alkylene group in resin molecules; #2 denotes a synthetic of 4,4'-methyledyne-2,6-xyledine-xylidine-bis-imide and 4,4'-diaminodiphenylmethane, which contains 13 wt.% of alkyl group in the resin molecules; #3 denotes 4,4'-methylene-di-2,6-diethylaniline-bis-imide and 1,4-bis (2-p-anilinopropylidene), which contains 24.5 wt.% of alkyl group in the resin molecules; #4 denotes a synthetic of 4,4,'-methylene-di-2,6-diisopropylaniline-bis-imide and 1,4-bis(2-p-anilinopropylidene)benzene, which contains 30 wt.% of alkyl group in the resin molecules; and #5 is a synthetic of 1,4-bis(2-p-anilinopropylidene)benzene-bis-imide and 1,4-bis(2-m-anilinopropylidene)benzene, which contains 17 wt.% of alkyl group in the resin molecule.

Further, the bromic resin employed as the flame retardant is one of four products (1)-(4) as listed in Tables 1 and 2, in which (1) is a bromic phenol-novolak type epoxy resin of a reaction type, known as BREN-S, produced by a Japanese firm NIPPON KAYAKU, (2) is a bromic bis-phenol A type epoxy resin of reaction type, known as YDB-400 produced by a Japanese firm TOHTO KASEI, (3) is a non-reaction type multicyclic aromatic series bromic resin, known as BC58 produced by a U.S. firm GREATLAKE, and (4) is another non-reaction type multicyclic aromatic series bromic resin, known as BC52 produced also by GREATLAKE. In this case, these bromic resins used as the flame retardant are represented by such chemical structure formulas as follows:

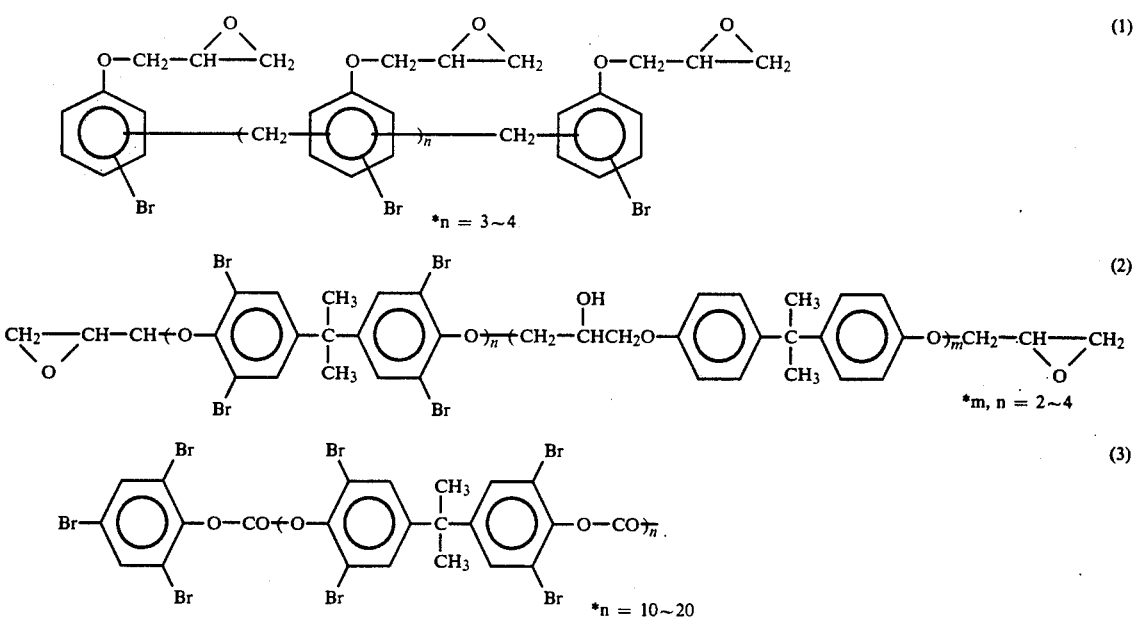

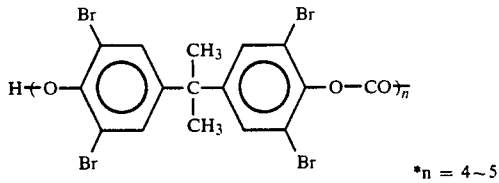

$*n = 4 \sim 5$                  (4)

For the setting accelerator, 2-ethyl-4-methyl imidazole known as 2E4MZ produced by a Japanese firm SHIKOKU KASEI was used in the respective Examples 1-25, with DMF used as the diluting solvent so as to render the solid resin component to be 60%.

COMPARATIVE EXAMPLES 1 and 2

The polyimide composition was prepared with such composition ratio as shown in Table 2 in the same manner as in Examples 1-25, and the prepreg as well as the laminate were obtained in the same manner as in Examples 1-25.

With respect to respective samples obtained through Examples 1-25 and Comparative Examples 1 and 2, measurement of the dielectric constant was carried out in accordance with the standard JIS-C6481, results of which were as shown also in Tables 1 and 2, and these results have proved that, as would be clear when the measurement results of Examples 1-25 are compared with those of Comparative Examples 1 and 2, the dielectric constant is effectively lowered by the addition of TAIC's to polyimide. Further, from comparison of the chemical structure between Examples 1-5 and 8-19 and Examples 6, 7 and 20-25, it has been found that the dielectric constant could be lowered to a larger extent in the case where more than 11 wt.% of alkyl group was contained in the resin molecules.

Further, the nonflammability test was carried out in accordance with the standard UL-94, results of which test were also as shown in Tables 1 and 2, and it has been found that Examples 8-16 and 19-25 in which the reaction type bromic resin having the reaction group was added could secure sufficient nonflammability while maintaining high level interlaminar bonding and thermal resistance, in contrast to Examples 17 and 18 in which the non-reaction type bromic resin having no reaction group is used.

Then, the prepreg weight W1 prior to the drying as well as the prepreg weight W2 after the drying at 180° C. for 30 minutes were measured, and volatilization component of the prepreg was determined by means of a formula $100 \times (W1-W2)/W1$. Results have shown that, as in Comparative Example 2, the use only with TAIC added entails in an abrupt volatilization at the drying step to render the half-setting, i.e., a stable achievement of the prepreg to be difficult and the volatilization during retainable prepreg state to be large, and the use only with TAIC added is considered to be a cause of blister or void involved in the laminate employing this prepreg. With the further presence of the TAIC polymer in addition to TAIC, as in Examples 1-25 and Comparative Example 1, the half-setting of the resin at the drying step can be achieved as-stabilized with the volatilization component in the state of the prepreg is made less so that, as will be readily appreciated by the one skilled in the art, the blister or void in the laminate due to the volatilization in the prepreg can be effectively prevented from occurring.

Further, the interlaminar bonding was measured by peeling one of layers forming the laminate off from others at right angles, according to which it has been found that the addition of the TAIC polymer by the weight-average molecular weight 20,000 as in Example 5 has resulted in a reduction of the interlaminar bonding to a large extent in contrast to other Examples, so as to render resultant compound to be not desirable. The respective laminates prepared through Examples 1-25 and Comparative Examples 1 and 2 were then subjected to a perforation of 1,000 pieces of the through holes with drill bits of a diameter of 0.4 mm under the conditions of 40,000 rpm and a feeding rate per revolution of $50\mu$/rev., and also to the through hole plating with the electroless plating and electroplating carried out concurrently in known manner, and the depth of infiltration of plated metal at the through holes as well as the roughness of peripheral wall of the through holes were measured by microscopically observing cross-section at the through holes of the laminates with respect to 990th to 1,000th ones of the through holes. As a result, the laminates according to any of Examples 1-7 employing the TAIC polymer of the weight-average molecular weight of 1,000, 8,000 and 20,000 and Examples 8-16 and 19-25 employing the reaction type flame retardant have clearly reduced the infiltration depth of the through-hole plated metal and the peripheral wall roughness, in contrast to Comparative Example 1. In respect of provision of the nonflammability, on the other hand, Examples 17 and 18 employing the non-reaction type bromic resin as further added but in the same amount as the reaction type bromic resin as in other Examples show that no sufficient nonflammability can be attained and still the thermal resistance is to be lowered. As the thermal resistance is lowered, a heat generated upon the perforation work with drills causes the peripheral wall surface of the through holes to be roughened and the infiltration depth of the plated metal enlarged even in contrast to Comparative Example 1. In addition, Example 7 shows that, while D glass can be employed as the base material for the prepreg to be contributive to a remarkable reduction of the dielectric constant, it is seen that the infiltration depth is rather apt to be expanded.

According to the present invention, proper composing members and their ratio of the polyimide composition are to be selected depending on the function having priority over others in the purpose of use of the compound.

In Tables 1 and 2 as in the followings, figures of the composition are denoted in parts by weight.

TABLE 1

| EXAMPLES |
|---|
| 5 |

TABLE 1-continued

|  | 1 | 2 | 3 | 4 | (comparative) | 6 | 7 |
|---|---|---|---|---|---|---|---|
| COMPOSITION RATIO | | | | | | | |
| Polyimide Resin | #1 | #1 | #1 | #1 | #1 | #5 | #5 |
| TAIC | 10 | 90 | 150 | 90 | 90 | 90 | 90 |
| TAIC Polymer (mol. wt. 1000) | 10 | 10 | 30 | — | — | 10 | 10 |
| TAIC Polymer (mol. wt. 8000) | — | — | — | 10 | — | — | — |
| TAIC Polymer (mol. wt. 20000) | — | — | — | — | 10 | — | — |
| Bromic Resin - React. Type | — | — | — | — | — | — | — |
| Bromic Resin - Non-React. Type | — | — | — | — | — | — | — |
| 2E4MZ | 0.1 | 0.1 | 0.1 | 0.1 | 0.1 | 0.1 | 0.1 |
| DMF | 130 | 130 | 180 | 130 | 130 | 130 | 130 |
| CHARACTERISTICS | | | | | | | |
| Dielectric Constant | 4.2 | 4.1 | 4.0 | 4.1 | 4.1 | 3.5 | 3.1 |
| Prepreg Volatil. Comp. (wt. %) | 0.1 | 0.4 | 0.4 | 0.3 | 0.3 | 0.10 | 0.10 |
| Interlaminar Bonding (kg/cm) | 1.6 | 1.5 | 1.4 | 1.1 | 0.8 | 1.7 | 1.7 |
| Infilt. Depth of Plating Sol. in Thru. Holes ($\mu$m) | | | | | | | |
| Max. | 90 | 50 | 50 | 70 | 70 | 77 | 92 |
| Avg. | 68 | 35 | 32 | 45 | 45 | 46 | 65 |
| Periph. Wall Rough. of The Holes ($\mu$m) | | | | | | | |
| Max. | 70 | 40 | 40 | 70 | 40 | 20 | 40 |
| Avg. | 30 | 10 | 10 | 32 | 12 | 10 | 17 |
| Nonflammability (UL-94) | HB | HB | HB | HB | HB | HB | HB |
| Therm. Resist. (°C.) | above 250 | above 250 | above 250 | above 250 | above 250 | above 250 | above 250 |

|  | EXAMPLES | | | | | |
|---|---|---|---|---|---|---|
|  | 8 | 9 | 10 | 11 | 12 | 13 (comparative) |
| COMPOSITION RATIO | | | | | | |
| Polyimide Resin | #1 | #1 | #1 | #1 | #1 | #1 |
| TAIC | 5 | 90 | 150 | — | 90 | 90 |
| TAIC Polymer (mol. wt. 1000) | 10 | 10 | 50 | 50 | — | — |
| TAIC Polymer (mol. wt. 8000) | — | — | — | — | 10 | — |
| TAIC Polymer (mol. wt. 20000) | — | — | — | — | — | 10 |
| Bromic Resin - React. Type | (1)10 | (1)25 | (1)40 | (1)20 | (1)25 | (1)25 |
| Bromic Resin - Non-React. Type | — | — | — | — | — | — |
| 2E4MZ | 0.1 | 0.1 | 0.1 | 0.1 | 0.1 | 0.1 |
| DMF | 130 | 130 | 130 | 180 | 130 | 130 |
| CHARACTERISTICS | | | | | | |
| Dielectric Constant | 3.9 | 3.8 | 3.7 | 3.9 | 3.8 | 3.8 |
| Prepreg Volatil. Comp. (wt. %) | 0.10 | 0.15 | 0.20 | 0.20 | 0.08 | 0.07 |
| Interlaminar Bonding (kg/cm) | 1.5 | 1.6 | 1.7 | 1.5 | 1.5 | 1.4 |
| Infilt. Depth of Plating Sol. in Thru. Holes ($\mu$m) | | | | | | |
| Max. | 80 | 72 | 63 | 73 | 72 | 71 |
| Avg. | 60 | 50 | 40 | 53 | 47 | 52 |
| Periph. Wall Rough. of The Holes ($\mu$m) | | | | | | |
| Max. | 25 | 24 | 20 | 23 | 22 | 22 |
| Avg. | 15 | 11 | 8 | 12 | 10 | 11 |
| Nonflammability (UL-94) | V-O | V-O | V-O | V-O | V-O | V-O |
| Therm. Resist. (°C.) | above 250 | above 250 | above 250 | above 250 | above 250 | above 250 |

TABLE 2

|  | EXAMPLES | | | | | | |
|---|---|---|---|---|---|---|---|
|  | 14 | 15 | 16 | 17 | 18 | 19 | 20 |
| COMPOSITION RATIO | | | | | | | |
| Polyimide Resin | #1 | #1 | #1 | #1 | #1 | #1 | #2 |
| TAIC | 90 | 90 | 90 | 90 | 90 | 90 | 90 |
| TAIC Polymer (mol. wt. 1000) | 10 | 10 | 10 | 10 | 10 | 10 | 10 |
| TAIC Polymer (mol. wt. 8000) | — | — | — | — | — | — | — |
| TAIC Polymer (mol. wt. 20000) | — | — | — | — | — | — | — |
| Bromic Resin - React. Type | (1)10 | (1)25 | (1)40 | — | — | (2)25 | (1)25 |
| Bromic Resin - Non-React. Type | — | — | — | (3)25 | (4)25 | — | — |
| 2E4MZ | 0.1 | 0.1 | 0.1 | 0.1 | 0.1 | 0.1 | |
| DMF | 130 | 130 | 130 | 130 | 130 | 130 | 130 |
| CHARACTERISTICS | | | | | | | |
| Dielectric Constant | 3.8 | 3.8 | 3.8 | 4.1 | 4.1 | 3.8 | 3.7 |
| Prepreg Volatil. Comp. (wt. %) | 0.10 | 0.10 | 0.10 | 0.4 | 0.4 | 0.10 | 0.10 |
| Interlaminar Bonding (kg/cm) | 1.5 | 1.6 | 1.7 | 1.0 | 1.1 | 1.6 | 1.5 |
| Infilt. Depth of Plating Sol. in Thru. Holes ($\mu$m) | | | | | | | |
| Max. | 70 | 70 | 71 | 200 | 200 | 72 | 80 |

TABLE 2-continued

|  | | | | | | | |
|---|---|---|---|---|---|---|---|
| Avg. Periph. Wall Rough. of The Holes (μm) | 45 | 52 | 48 | 150 | 150 | 52 | 47 |
| Max. | 23 | 23 | 23 | 110 | 110 | 22 | 23 |
| Avg. | 12 | 9 | 10 | 50 | 50 | 11 | 12 |
| Nonflammability (UL-94) | V-O | V-O | V-O | HB | HB | V-O | V-O |
| Therm. Resist. (°C.) | above 250 | above 250 | above 250 | below 230 | below 230 | above 250 | above 250 |

|  | EXAMPLES | | | | | COMP. EX. | |
|---|---|---|---|---|---|---|---|
|  | 21 | 22 | 23 | 24 | 25 | 1 | 2 |
| COMPOSITION RATIO | | | | | | | |
| Polyimide Resin | #3 | #4 | #4 | #5 | #5 | #1 | #1 |
| TAIC | 90 | 90 | 90 | 90 | 90 | — | 100 |
| TAIC Polymer (mol. wt. 1000) | 10 | 10 | — | 10 | 10 | — | — |
| TAIC Polymer (mol. wt. 8000) | — | — | 10 | — | — | — | — |
| TAIC Polymer (mol. wt. 20000) | — | — | — | — | — | — | — |
| Bromic Resin - React. Type | (1)25 | (1)25 | (1)40 | (1)25 | (1)25 | — | — |
| Bromic Resin - Non-React. Type | — | — | — | — | — | — | — |
| 2E4MZ | 0.1 | 0.1 | 0.1 | 0.1 | 0.1 | 0.1 | 0.1 |
| DMF | 130 | 130 | 130 | 130 | 130 | 130 | 130 |
| CHARACTERISTICS | | | | | | | |
| Dielectric Constant | 3.6 | 3.4 | 3.4 | 3.6 | 3.1 | 4.4 | 4.1 |
| Prepreg Volatil. Comp. (wt. %) | 0.10 | 0.10 | 0.10 | 0.10 | 0.10 | 0.2 | 5.3 |
| Interlaminar Bonding (kg/cm) | 1.6 | 1.6 | 1.5 | 1.7 | 1.7 | 1.5 | 1.5 |
| Infilt. Depth of Plating Sol. in Thru. Holes (μm) | | | | | | | |
| Max. | 75 | 80 | 82 | 80 | 90 | 130 | 60 |
| Avg. | 42 | 48 | 50 | 50 | 60 | 95 | 37 |
| Periph. Wall Rough. of The Holes (μm) | | | | | | | |
| Max. | 22 | 22 | 23 | 22 | 32 | 80 | 40 |
| Avg. | 10 | 9 | 9 | 10 | 18 | 36 | 13 |
| Nonflammability (UL-94) | V-O | V-O | V-O | V-O | V-O | HB | HB |
| Therm. Resist. (°C.) | above 250 | above 250 | above 250 | above 250 | above 250 | above 250 | above 250 |

What is claimed is:

1. A prepreg for use in multilayered printed-wiring boards, comprising:
    a base material impregnated with a polyimide composition which is half-set, said polyimide composition comprising 100 parts by weight of polyimide, 10 to 200 parts by weight of a triallyl isocyanurate composition, and a diluting solvent;
    wherein said polyimide is prepared through reaction to unsaturated bisimide and diamine, more than 11 wt.% of the polyimide comprising alkyl, alkylene exclusive of methylene, or a mixture thereof; and
    wherein said triallyl isocyanurate composition comprises up to 100 parts by weight of at least one non-polymeric triallyl isocyanurate to 1 part by weight of triallyl isocyanurate polymer having a weight-average molecular weight in the range of 500 to 10,000.

2. The prepreg of claim 1, wherein said polyimide composition further consists of an accelerator.

3. The prepreg of claim 1, wherein said polyimide composition further includes bromic resin having a reaction group and added in a range of 1 to 50 parts by weight in bromine content to 100 parts by weight of polyimide.

4. The prepreg of claim 3, wherein said bromic resin is a bromic epoxy resin.

5. A laminate of multilayered printed-wiring boards, comprising at least two prepregs and at least an interlaminar layer metal circuit pattern disposed between said at least two prepregs, each said prepreg comprising a base material impregnated with a polyamide composition which is half-set, said polyimide composition comprising 100 parts by weight of polyimide, 10 to 200 parts by weight of a triallyl isocyanuarte composition, and a diluting solvent;
    wherein said polyimide is prepared through reaction of unsaturated bisimide and diamide, more than 11 wt.% of the polyimide comprising alkyl, alkylene exclusive of methylene, or a mixture thereof; and
    wherein said triallyl isocyanurate composition comprises up to 100 parts by weight of at least one non-polymeric triallyl isocyanurate to 1 part by weight of triallyl isocyanurate polymer having a weight-average molecular weight in a range of 500 to 10,000.

6. The laminate of claim 5, wherein said polyimide composition further includes an accelerator.

7. The laminate of claim 5, wherein said polyimide composition further includes bromic resin having a reaction group and added in a range of 1 to 50 parts by weight in bromine content to 100 parts by weight of polyimide.

8. The laminate of claim 7, wherein said bromic resin is a bromic epoxy resin.